US006936920B2

(12) United States Patent
Whitefield

(10) Patent No.: US 6,936,920 B2
(45) Date of Patent: Aug. 30, 2005

(54) VOLTAGE CONTRAST MONITOR FOR INTEGRATED CIRCUIT DEFECTS

(75) Inventor: Bruce Whitefield, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/652,369

(22) Filed: Aug. 29, 2003

(65) Prior Publication Data

US 2005/0046019 A1 Mar. 3, 2005

(51) Int. Cl.[7] ........................................ H01L 23/34
(52) U.S. Cl. ........................................ 257/724; 257/723
(58) Field of Search ........................................ 257/723, 724

(56) References Cited

U.S. PATENT DOCUMENTS

2002/0010887 A1 * 1/2002 Whetsel ........................ 714/727

* cited by examiner

*Primary Examiner*—Long Pham
(74) *Attorney, Agent, or Firm*—Trexler, Bushnell, Giangiorgi, Blackstone and Marr Ltd.

(57) ABSTRACT

A semiconductor chip is provided which includes active and inactive IP cores. The spaces on the metal layer associated with the inactive IP cores includes voltage contrast inspection structures. The voltage contrast inspection structures serve to provide improved planarization of the metal layer and provided improved inspection capabilities.

4 Claims, 3 Drawing Sheets

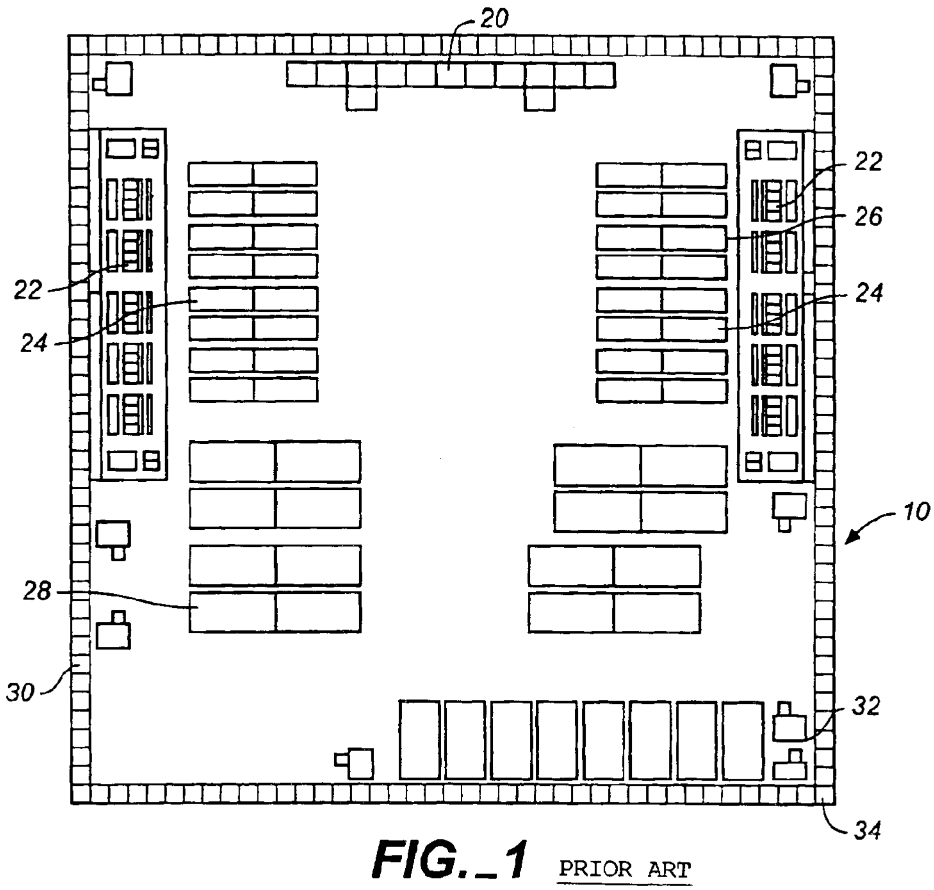
FIG._1 PRIOR ART
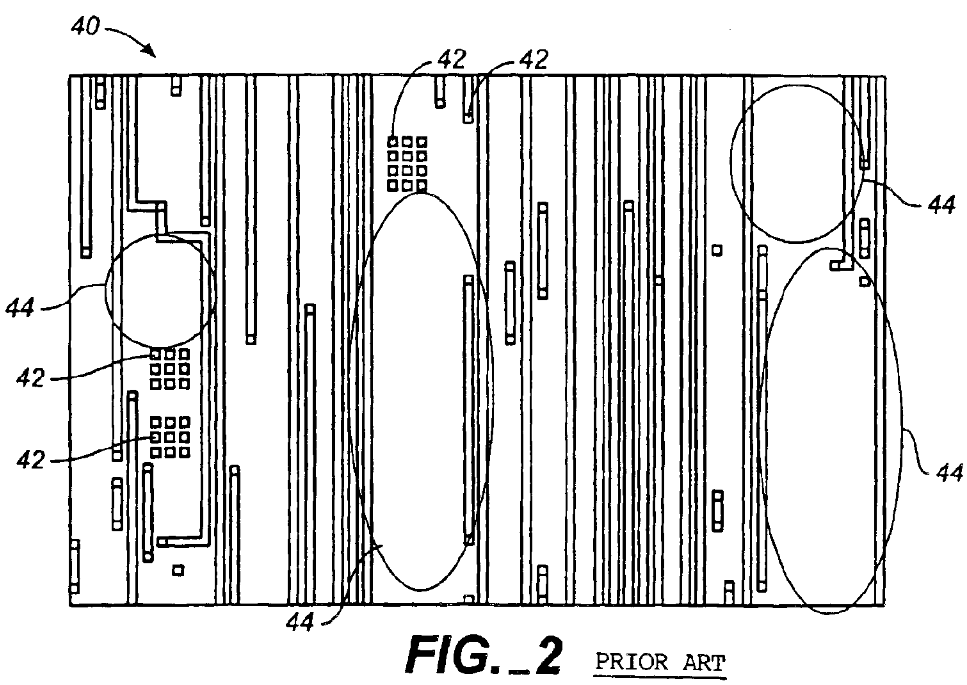
FIG._2 PRIOR ART

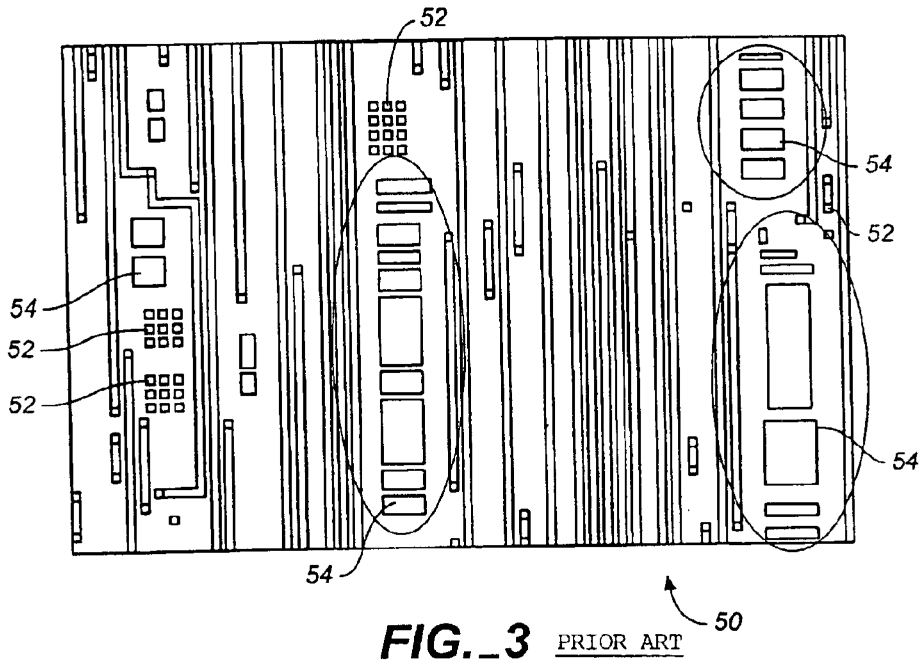
FIG._3 PRIOR ART
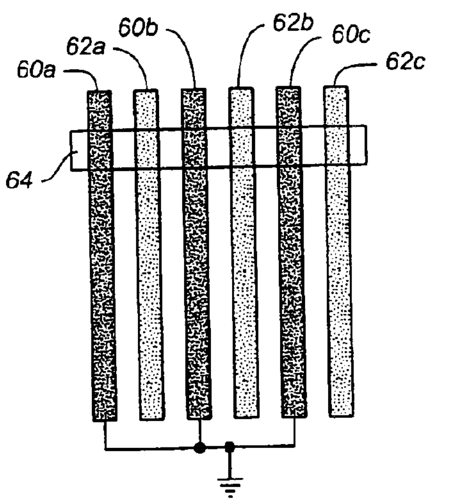
FIG._4A PRIOR ART
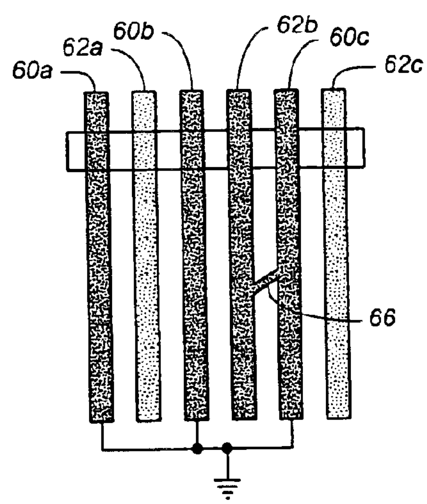
FIG._4B PRIOR ART

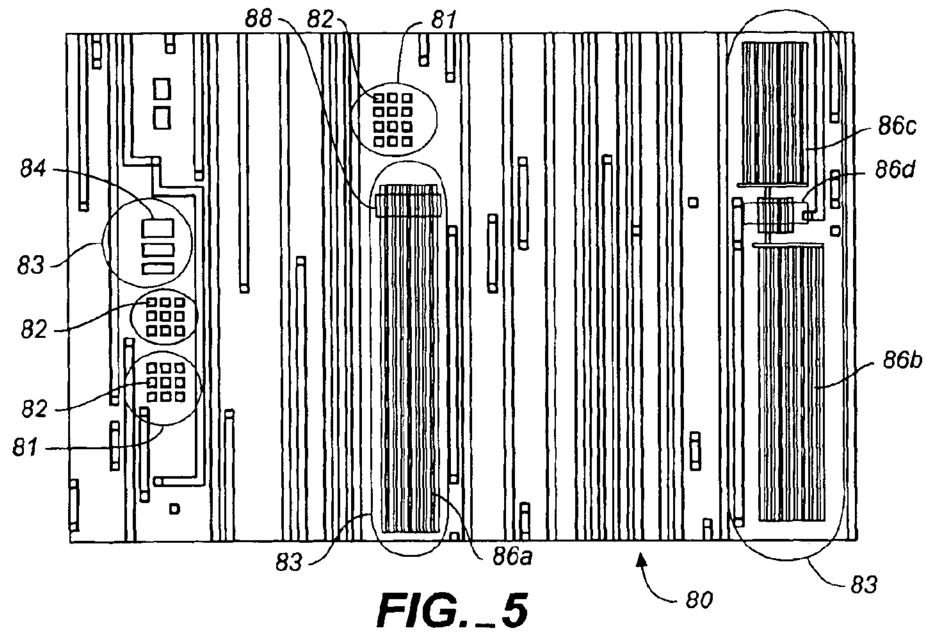
FIG._5
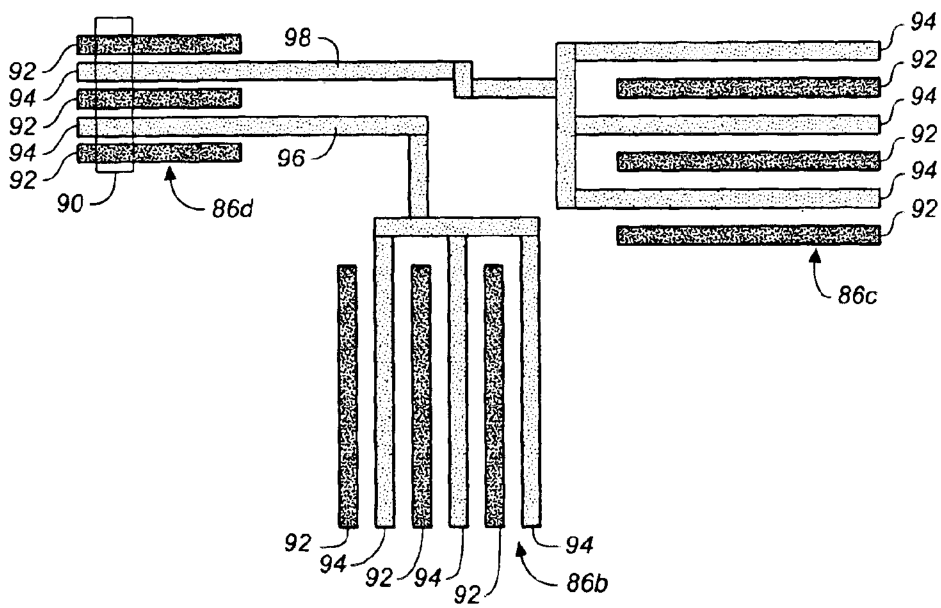
FIG._6

VOLTAGE CONTRAST MONITOR FOR INTEGRATED CIRCUIT DEFECTS

BACKGROUND OF THE INVENTION

The present invention relates to chip design and manufacturing. More specifically, the invention relates to a chip which includes structures for identifying defects within the chip while at the same time providing a chip which can be properly planarized using a chemical mechanical polishing process (CMP).

Chip design can be very time consuming and thus expensive. Design packages such as, Rapid Chip®, owned by LSI Logic, Corp. simplify the design layout by routing power and ground in a standard pattern which is easier to simulate. Unlike previous designs where power and ground were mostly routed around the periphery of the chip, the standard pattern make power and ground more readily available across the chip.

Another way in which design packages, such as, for example, Rapid Chip® improve the efficiency of chip design is through the use of IP (Intellectual Property) cores. IP cores act as building blocks for chip design by providing pre-designed structure for commonly used components. Rather than designing each component, designers can place these IP cores within their design to improve the efficiency of the design process.

Rapid Chip® packages commonly used IP cores together and therefore provides a base from which the designer can begin to create a custom design. For example, a designer selects a pre-designed chip which includes a number of IP cores which the designer desires to include in his/her chip design. A floor plan is provided by the various IP cores and the designer adds to these IP cores to complete the design. In addition, to the IP cores which the designer desires to include in the chip, the layout will likely include extra IP cores which are not needed in the design and therefore will be inactive. An example of a Rapid Chip® floor plan 10 is shown in FIG. 1. The floor plan includes, for example, a DDR-80 bits core 20, HyperPHY20 channels cores 22, 256×80 Dual Port RAMs core 24, 2M Usable Gates core 26, 2k×80 Single Port RAMs core 28, PLLs cores 30, 10G Ethernet MAC Logic core 32, and GigaBlaze 8 channels core 34. When designing the metal interconnect portion of the design, the designer will simply leave the unwanted IP cores disconnected and therefore inactive. As a result, the metal interconnect space relating the inactive IP cores will be unused. This unused space results in a variation to the pattern density across the chip and therefore across the wafer. Unused space on the chip can also occur on chips that do not use IP cores or do not have any unused cores simply through the methods used to layout the connecting metal lines. An example of a portion of a metal layer 40 is shown in FIG. 2. The metal layer includes active structures 42 associated with active IP cores within active areas of the design or used as interconnect for customized logic. In addition, the metal layer includes large open areas 44 which relate to the inactive IP cores, other unused areas of the floor plan, or simply as a result of the interconnect layout routing. Thus, the metal layer layout includes a variation in pattern density across the chip.

As a result of the variation in pattern density, it is difficult for the CMP (chemical mechanical polishing) process to planarize properly. Attempts have been made to improve CMP processing and/or equipment to be less effected by changes in pattern density, however, only limited success has been achieved. Another way in which the CMP planarzation problem has been address is by using different planarization processes for chips of different pattern densities. Although limited success has been experienced with this method, special handling is often required to divide wafers of different devices and special software systems are required to provide different recipes for the different device types. Another method which has been used to alleviate the problems with variations in pattern densities is to place metal utilization dummy structures in the unused portions of the chip. i.e. the portions of the chip relating to the inactive IP cores. An example of this method is shown in FIG. 3. The metal layer 50 includes active structures 52 associated with the active IP cores and other active circuitry and dummy metal structures 54 which have been provided in the otherwise large open areas of the metal layer.

In addition to the limited success experienced with each of the methods currently used to address the problems with variations in pattern densities, these solutions do not address the un-utilized space on the chip. The creation of the silicon area relating to the inactive IP cores is costly to process, provides no value to the processed device, and as such can be seen as wasted.

Another problem currently encountered with chip manufacturing is the ability to detect defects. In particular, defects which occur as a result of Cu dual damascene processing are especially difficult to detect. The dual damascene process is often used to create inlaid metal patterns on the wafer. Two patterning steps are used to create features of two different depths which relate to the wiring level and the inter level connections. The patterns are then filled with metal and a polishing step is used to create the inlaid structure. Defects in chips made using the damascene process, are difficult to detect because the defects are buried in the bottom of trenches or occur at one of the many interface layers such as that between a via and a large metal line. Thus, the defects are not readily detected using common optical and laser reflectance based inspection tools.

One approach to finding hidden defects involves performing a failure analysis of the failing parts after the wafer test. The failure analysis after wafer test requires extensive work in order to isolate the fault to a particular area on the chip. In this case, the device must be de-processed to determine the cause of the defect. This approach can take a long time and can require an array of expensive equipment. As a result the success rate of finding the defect is only about 60%. In addition, after the problem is discovered, results from failure analysis can take as long as weeks or months to obtain.

Another approach to finding hidden defects involves the use of test chips with structures which can be electrically probed. These test chips are run in the same manufacturing line as the product chip, however, they are produced in a different lot, which of course is run for the purpose of identifying defects and is not sold to the customer. Test chips with structures which can be electrically probed can be very effective in identifying issues in the manufacturing line, however, running lots for the purpose of creating test chips can be very expensive. In addition, the test chips only provide information about the test lot and therefore may not provide information needed about a particular lot. Therefore, it is difficult to use the test chips for quality checks or to trouble shoot specific problems. Another problem with using test structures for electrically probing is that the test structures can only be used at certain steps in the line. Finally, because Cu is a soft metal, probing can be difficult as it often results in damaging the Cu or spreading the defect.

A method to address the issue of detecting hidden defects that has been gaining recent attention is Voltage Contrast inspection. FIGS. 4*a* and 4*b* represent voltage contrast inspection structures. FIG. 4*a* represents a voltage contrast inspection structure in which no short is present and FIG. 4*b* represents a voltage contrast inspection structure which includes a short. As shown, voltage contrast inspection functions by placing electrically grounded structures 60*a*–60*c* next to electrically floating structures 62*a*–62*c*, typically these structures are in the form of lines. The structures to be kept at the same electrical potential are connected to each other through the inter metal layer vias or routed metal lines. An area to be scanned or inspection zone 64 is selected and a scanning electron microscope (SEM) is used to electrically charge the inspection zone 64. The whole structure need not be inspected to determine a fault, rather only the inspection zone 64 must be inspected. Different materials will pick up a different level of charge based upon its characteristics. Similar materials, such as metal, will charge up or not depending on if they are grounded or not. Using the SEM, the electron beam image will interact with the charge on the structures to be viewed. As a result the metal lines 60*a*–60*c*, 62*a*–62*c* will appear lighter or darker depending on if it is insulated (retaining charge) or grounded (not charged). Voltage contrast inspection takes advantage of this effect to detect the difference between floating structures 62*a*–62*c* and grounded structures 60*a*–60*c*. By placing a floating structure 62 next to a grounded structure 60 a very small electrical short can be detected by the change in contrast. An example of such a short 66 is shown in FIG. 4*b*. As a result of the short 66, the floating metal structure 62*b* appears dark rather than light. Thus, inspection of the inspection zone 64 reveals three adjacent dark structures 60*b*, 62*b*, 60*c* rather than alternating dark and light structures. As such the inspector or automated SEM based inspection tool is alerted to the defect. This technique is very sensitive and can detect currents shorting as low as 1 nano amp at a 1 volt potential.

One problem with voltage contrast inspection on the actual product wafers is that it is very slow since the entire chip area must be inspected. It is also ineffective since the layout of the chip will have many combinations and degrees of grounding and floating structures so that it is difficult to know just how much of the chip is actually inspected.

The present invention provides a chip which overcomes the problems in the prior art and which provides additional advantages over the prior art, such advantages will become clear upon reading of the attached specification in combination with a study of the drawings.

OBJECTS AND SUMMARY

An object of an embodiment of the present invention is to reduce variation in pattern density.

Another object of an embodiment of the present invention is to improve planarization of the chip.

Yet another object of an embodiment of the present invention is to utilize otherwise un-utilized portions of the chip.

A further object of an embodiment of the present invention is to provide a chip which can be more easily inspected for defects.

Still a further object of an embodiment of the present invention is to provide a more efficient manufacturing and testing process.

Briefly, and in accordance with at least one of the foregoing objects, an embodiment of the present invention provides a chip which includes inactive IP cores and extra metal interconnect space associated with the inactive IP cores. Voltage contrast inspection structures are provided within the extra metal interconnect space to provide improved planarization and to provide an inspection tool for the purpose of locating defects within the chip.

Another embodiment of the present invention provides a chip which has unused space on due to interconnect metal routing patterns between active circuits. Voltage contrast inspection structures are provided within the extra metal interconnect space to provide improved planarization and to provide an inspection tool for the purpose of locating defects within the chip.

BRIEF DESCRIPTION OF THE DRAWINGS

The present invention and the advantages thereof will become more apparent upon consideration of the following detailed description when taken in conjunction with the accompanying drawings, wherein like reference numeral represent like elements and wherein:

FIG. 1 is a top plan view of a floor plan including various IP cores;

FIG. 2 is a top plan view of a metal layer including large open areas;

FIG. 3 is a top plan view of a metal layer including dummy metal structures in the large open areas;

FIG. 4*a* is a diagram which represents voltage contrast structures;

FIG. 4*b* is a diagram which represents voltage contrast structures in which a short is present;

FIG. 5 is a top plan view of a metal layer of the present invention; and

FIG. 6 is a diagram which represent the voltage contrast structures of the present invention.

DESCRIPTION

While the invention may be susceptible to embodiment in different forms, there are shown in the drawings, and herein will be described in detail, a specific embodiment with the understanding that the present disclosure is to be considered an exemplification of the principles of the invention, and is not intended to limit the invention to that as illustrated and described herein.

A portion of the metal layer 80 of a chip designed in accordance with the present invention is shown in FIG. 5. Design of the chip including the metal layer 80 can be carried out using any one of a variety of chip design tools, such as, for example, Rapid Chip®. The design layout includes a number of IP cores some of which will be used or active in the design and other IP cores which are not needed within the design and therefore will remain inactive as the metal layer 80 will not include interconnects to these inactive IP cores.

The metal layer 80 includes active metal spaces 81 associated with the active IP cores and inactive metal spaces 83 associated with the inactive IP cores. The inactive metal spaces 83 may also be provided due to the layout of the metal connecting lines. The metal layer 80 includes metal interconnect structures 82 which relate to the active IP cores and other active circuitry, dummy metal structures 84, and voltage contrast test structures 86*a*, 86*b*, 86*c*, 86*d*. The metal interconnect structures 82 provide, for example, power, ground, and signals to the active IP cores and the additional active circuitry. The dummy metal structures 84 are provided in the inactive spaces 83 on the metal layer 80 and function to improve planarization of the metal layer 80. The voltage contrast test structures 86*a*–86*d* are provided in the inactive spaces 83 of the metal layer 80. The voltage contrast test structures 86*a*–86*d* also provide improved planarization to the metal layer 80. In addition, as will be described herein the voltage contrast inspection structures 86*a*–86*d* provide a tool for determining whether faults or defects are present in the chip.

Voltage contrast inspection structure 86*a* includes an inspection zone 88. Inspection zone 88 extends across the width of the voltage contrast inspection structure 86*a* and provides an area for inspecting the inspection structure 86*a* without requiring inspection of the entire voltage contrast inspection structure 86*a*.

A diagram representing the voltage contrast structures 86*b*–86*d* is provided in FIG. 6. As shown in FIG. 6, each voltage contrast structure 86*b*–86*d* includes alternating ground structures 92 and floating structures 94. The floating structures 94 of the voltage contrast inspection structure 86*b* are electrically connected to the floating structures 94 of the voltage contrast inspection structure 86*d* through a floating interconnection 96. The floating structures 94 of the voltage contrast inspection structure 86*c* are electrically connected to the floating structures 94 of the voltage contrast inspection structure 86*d* through a floating interconnection 98. An inspection zone 90 is provided within the voltage contrast inspection structure 86*d*. Inspection of the voltage contrast inspection structures 86*b*–86*d* can be accomplished by inspecting the inspection zone 90. Thus, by electrically connecting the voltage contrast inspection structures and providing a "central" inspection zone 90, several voltage contrast inspection structures can be inspected simply by viewing the inspection zone 90. Although, only three voltage contrast inspection structures 86*b*–86*d* are shown in FIG. 6, it is to be understood that any number of structures could be connected to a central inspection zone through floating interconnections. By centrally connecting a large number of voltage contrast inspection structures together, a large percentage of the chip can be inspected relatively quickly.

Using a design tool, such as, for example, Rapid Chip the voltage contrast inspection structures 86*a*–86*d* are incorporated into the chip design. As the voltage contrast inspection structures 86*a*–86*d* occupy the inactive spaces on the metal layer 80, the area of the die does not need to be increased to provide space for the inspection structures 86*a*–86*d*. Thus, the present invention provides an improved ability to inspect the chip without increasing the area of the chip.

In addition to the fact that the present invention does not increase the size of the chip, the present invention provides improved inspection capabilities. As previously discussed, a typical method for inspecting chips involves the manufacture of test chips. In order to manufacture test chips, the manufacture of product chips on the manufacturing line is interrupted and test chips are manufactured. Unlike test chips, the present invention integrates voltage contrast inspection structures 86*a*–86*d* within the chip design so that test chips are not necessary to provide inspection information. As each product chip includes the voltage contrast inspection structures, there is no need to interrupt the manufacturing process to carry out an inspection. An inspection can occur, for example, by inspecting the inspection zones on every 10th chip. If a defect is discovered on the chip, the entire wafer can then be inspected to determine the extent of the defect. Thus, resources are not spent on test chips and therefore a cost savings results.

The voltage contrast test structures can also be used to predict defects which may occur in the manufacturing process. The voltage contrast test structure can by designed in manner which make theses structures more sensitive to defects that the active design structures. By making the voltage contrast test structures more sensitive to defects, defects will occur in the test structure prior to defects occurring in the active circuitry. In this manner, the voltage contrast test structures will provide an early indication of problems in the manufacturing line. Therefore, manufacturing problems can be detected and corrected before defective or faulty chips are manufactured.

In addition to finding hidden defects which occur during the manufacturing process placement of the voltage contrast inspection structures in the unutilized space on the chip also provide the dummy metal needed for planarization. The improved planarization results in improved CMP.

While embodiments of the present invention are shown and described, it is envisioned that those skilled in the art may devise various modifications of the present invention without departing from the spirit and scope of the appended claims.

What is claim is:

1. A semiconductor chip comprising:

a plurality of inactive IP cores;

a metal layer;

a plurality of spaces on said metal layer associated with the said plurality of inactive IP cores;

a plurality of voltage contrast inspection structures within said plurality of spaces on the metal layer, wherein at least one of said plurality of voltage contrast inspection structures includes an inspection zone; and wherein a number of said plurality of voltage contrast inspection structures are electrically connected to said at least one voltage contrast inspection structure including an inspection zone.

2. A semiconductor chip as defined in claim 1, wherein said voltage contrast inspection structure includes alternating ground structures and floating structures.

3. A Semiconductor chip comprising:

a metal layer;

a plurality of spaces on said metal layer; and a plurality of voltage contrast inspection structures within said plurality of spaces on the metal layer, wherein at least one of said plurality of voltage contrast inspection structures includes an inspection zone; and wherein a number of said plurality of voltage contrast inspection structures are electrically connected to at least one voltage contrast inspection structure including an inspection zone.

4. A semiconductor chip as defined in claim 3, wherein said voltage contrast inspection structure includes alternating ground structures and floating structures.

* * * * *